US011252846B2

(12) United States Patent
Inamasa (10) Patent No.: US 11,252,846 B2
(45) Date of Patent: Feb. 15, 2022

(54) VENTILATION DEVICE, VENTILATION UNIT, AND POWER CONVERSION DEVICE

(71) Applicant: TOSHIBA MITSUBISHI-ELECTRIC INDUSTRIAL SYSTEMS CORPORATION, Chuo-ku (JP)

(72) Inventor: Keisuke Inamasa, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 17/040,734

(22) PCT Filed: Apr. 24, 2019

(86) PCT No.: PCT/JP2019/017472
§ 371 (c)(1),
(2) Date: Sep. 23, 2020

(87) PCT Pub. No.: WO2020/217350
PCT Pub. Date: Oct. 29, 2020

(65) Prior Publication Data
US 2021/0243920 A1 Aug. 5, 2021

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01)

(58) Field of Classification Search
None
See application file for complete search history.

(56) References Cited

U.S. PATENT DOCUMENTS

| 6,468,054 B1* | 10/2002 | Anthony ................. F04D 25/12 417/360 |
| 7,731,477 B2* | 6/2010 | Emi ........................ F24F 7/025 415/126 |
| 2011/0259550 A1* | 10/2011 | Komaba ............... F16K 15/035 165/96 |
| 2013/0056090 A1* | 3/2013 | Tang .................. H05K 7/20181 137/215 |
| 2017/0055368 A1* | 2/2017 | Fuke .................. H05K 7/20581 |
| 2018/0279506 A1* | 9/2018 | Takasaki ............ H05K 7/20172 |

FOREIGN PATENT DOCUMENTS

JP 2018-79757 A 5/2018

* cited by examiner

Primary Examiner — Mukundbhai G Patel
(74) Attorney, Agent, or Firm — Oblon, McClelland, Maier & Neustadt, L.L.P.

(57) ABSTRACT

A ventilation device of an embodiment includes a housing, a shutter case, a fan, and a shutter. The shutter case has an opening. The fan is configured to exhaust air inside the housing to outside through the opening. The shutter partitions inside of the shutter case into a first chamber communicating with the opening and a second chamber different from the first chamber, and opens and closes the opening by a rotating operation. The fan is arranged on a first chamber side of the shutter case in the housing. The first chamber is a positive pressure region of the fan. The second chamber is a negative pressure region of the fan. The second chamber of the shutter case communicates only with the negative pressure region in the housing. The shutter is provided so that a pressure received from the second chamber is smaller than a pressure received from the first chamber.

11 Claims, 4 Drawing Sheets

VENTILATION DEVICE, VENTILATION UNIT, AND POWER CONVERSION DEVICE

TECHNICAL FIELD

Embodiments of the present invention relate to a ventilation device, a ventilation unit, and a power conversion device.

BACKGROUND ART

For example, a ventilation device for cooling a heating element such as a power conversion unit provided in a housing is known. The ventilation device includes, for example, a hood provided on an outer surface of the housing, a shutter for opening and closing an exhaust port of the hood, and a fan disposed in the hood. The ventilation device opens the shutter, drives the fan, and exhausts the air in the housing to the outside through the exhaust port. Thereby, the temperature rise of the air in the housing can be suppressed, and the cooling of the heating element can be promoted.

In order to improve the cooling performance of the heating element, a plurality of ventilation devices may be provided in the housing. In such a case, only a predetermined ventilation device among a plurality of ventilation devices is driven according to the temperature and specifications of the heating element. A stopped ventilation device blocks the shutter. This can prevent a short circuit in which air circulates between the driven ventilation device and the stopped ventilation device. Therefore, the air in the housing can be reliably exhausted by the fan.

If a simple structure is used for opening and closing the shutter without using a driving device or the like, it is conceivable that the shutter is rotatably provided on the hood and the exhaust port is closed by the weight of the shutter. In this case, the air pressure of the fan is used to open the exhaust port.

However, when the shutter is rotatably provided on the hood and the opening/closing operation of the exhaust port is performed using the own weight of the shutter or the wind pressure of the fan, it is necessary to accurately position the rotation axis with respect to the shutter. In other words, if the position of the rotation axis is set so that the shutter is reliably closed by its own weight, the shutter is too heavy and the exhaust port cannot be opened by the wind pressure of the fan, so that the function of the shutter may not be satisfied.

Even if the position of the rotating shaft can be properly set, the pressure loss in the device varies depending on the power conversion device to be applied, so that the wind pressure of the fan may decrease or the rotating shaft may deteriorate over time. In such a case, the opening and closing operation of the shutter may not be performed properly.

As described above, it is necessary to design and manufacture the shutter in consideration of various factors, and there has been a problem that the design and manufacturing operations are complicated.

CITATION LIST

Patent Document

Patent Document 1

Japanese Unexamined Patent Application, First Publication No. 2018-79757

SUMMARY OF INVENTION

Problems to be Solved by the Invention

The problem to be solved by the present invention is to provide a ventilation device, a ventilation unit, and a power conversion device that can facilitate the design and manufacture of a shutter.

Means for Solving the Problems

The ventilation device of the embodiment includes a housing, a shutter case, a fan, and a shutter. The shutter case is attached to the housing and has an opening. The fan blows outside air into the housing through the opening and exhausts air inside the housing to the outside through the opening. The shutter is rotatably provided in the shutter case, and partitions the inside of the shutter case into a first chamber communicated with the opening and a second chamber different from the first chamber, and opens and closes the opening by a rotation operation. The fan is arranged on one of a first chamber side of the shutter case and the first chamber of the shutter case. The first chamber is a first region of one of a positive pressure region and a negative pressure region of the fan. The second chamber is a second region of the other of the positive pressure region and the negative pressure region of the fan. The second chamber of the shutter case communicates only with the same region as the second region in the housing. The shutter is provided so that the pressure received from the second chamber is smaller than the pressure received from the first chamber.

EMBODIMENTS FOR CARRYING OUT THE INVENTION

Hereinafter, a ventilation device, a ventilation unit, and a power conversion device according to an embodiment will be described with reference to the drawings.

First Embodiment

Figure 1:
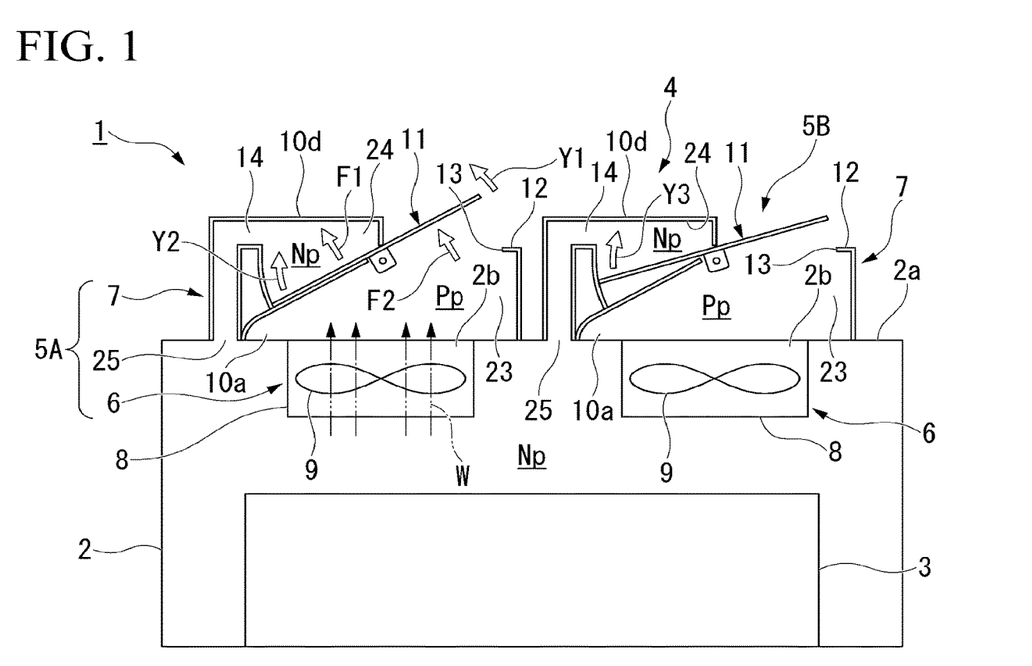
FIG. 1 is a schematic configuration diagram of a power conversion device according to a first embodiment.

FIG. 1 is a schematic configuration diagram of the power conversion device 1.

As shown in FIG. 1, a power conversion device 1 includes a box-shaped housing 2, a power conversion unit 3 housed in the housing 2, and a ventilation unit 4 mounted on one surface 2a of the housing 2.

The power conversion unit 3 includes, for example, at least one of a conversion device that converts AC power into DC power and an inverter that converts DC power into AC power. The power conversion device 1 only needs to include at least one power conversion unit 3. The power conversion unit 3 generates heat when driven.

The ventilation unit 4 includes a plurality of (for example, two in the first embodiment) ventilation devices 5A and 5B. The basic configuration of each ventilation device 5A, 5B is the same. Therefore, in the following description, only one ventilation device 5A will be described, and the description of the other ventilation device 5B will be assigned the same reference numerals as those of the one ventilation device 5A and will not be repeated.

In the following description, one surface 2a of the housing 2 to which the ventilation unit 4 is attached is the upper surface of the housing 2 in the direction of gravity. The inside of the housing 2 refers to the inside surrounded by the housing 2, and the outer surface side of the housing 2 refers to the outside of the housing 2. If necessary, in the following description, a vertical direction in the direction of gravity (the normal direction of the surface 2a of the housing 2) is defined as a Z direction, a surface direction of the surface 2a of the housing 2 which is along one side of the housing 2 is defined as an X direction, and a direction orthogonal to the Z direction and the X direction is defined as a Y direction.

The ventilation device 5A includes a fan 6 provided inside the one surface 2a of the housing 2 and a shutter unit 7 provided outside the one surface 2a of the housing 2.

The fan 6 mainly includes a fan shroud 8 attached to one surface 2a of the housing 2 and a fan blade 9 rotatably fixed to the fan shroud 8.

As the fan blade 9, for example, a fan blade for an axial fan is used. The fan blade 9 is driven to rotate by a fan motor (not shown). The rotation axis of the fan blade 9 is along the normal direction of the one surface 2a of the housing 2. Hereinafter, the rotation axis direction of the fan blade 9 may be simply referred to as an axial direction.

The fan shroud 8 is formed in a substantially cylindrical shape so as to surround the periphery of the fan blade 9. The central axis of the fan shroud 8 coincides with the axial direction of the fan blade 9.

A substantially circular opening 2b is formed on one surface 2a of the housing 2 at a position facing the fan blade 9 in the axial direction, as viewed in the axial direction. When the fan blade 9 rotates, the wind W flows in the axial direction, and the air in the housing 2 is exhausted to the outside of the housing 2 through the fan shroud 8, the fan blade 9, and the opening 2b. That is, the inside of the housing 2 and the outside of the fan shroud 8 is a negative pressure region Np by the fan 6. The outside from one surface 2a of the housing 2 is a positive pressure region Pp by the fan 6.

Although not particularly shown, the housing 2 has a suction port for sucking outside air formed on the other surface separated from the fan 6. Thereby, the wind W flows so as to pass through the power conversion unit 3 in the housing 2.

On one surface 2a of the housing 2, a housing communication port 25 is formed radially outside the fan shroud 8. The casing communication port 25 communicates with an air passage 16 of a duct 15 described later provided in the shutter unit 7.

Figure 2:
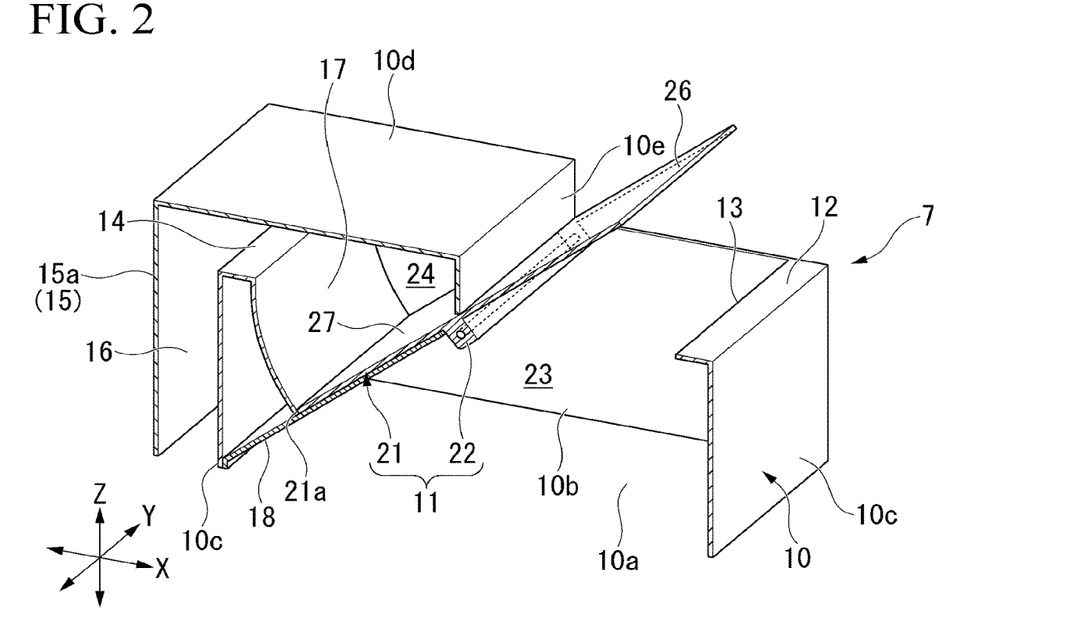
FIG. 2 is a perspective view of a cross section along the X-Z plane of the shutter unit according to the first embodiment.

FIG. 2 is a perspective view of a cross section of the shutter unit 7 along the X-Z plane.

As shown in FIGS. 1 and 2, the shutter unit 7 is disposed outside the outer surface 2a of the housing 2 (outer surface).

The main configuration of the shutter unit 7 includes a box-shaped shutter case 10 having an opening 10a formed on one surface 2a side of the housing 2, and a shutter 11 rotatably provided on the shutter case 10 and partitioning the inside of the shutter case 10 into two rooms (a positive pressure chamber 23 and a negative pressure chamber 24).

The size of the shutter case 10 is sufficiently smaller than the size of the housing 2. The shutter case 10 has two side surfaces 10b along the X-Z plane, two side surfaces 10c along the Y-Z plane, and top plate 10d connected to each side surface 10b, 10c at the end opposite to the housing 2. An opening 10a is formed by each of the side surfaces 10b and 10c. The opening 10a is in communication with the opening 2b of the housing 2.

The top plate 10d is arranged along the X-Y plane. In the top plate 10d, a concave portion 12 is formed in a half on one side centering on the approximate center in the X direction via a step surface 10e. An exhaust port (corresponding to an opening in the claims) 13 is formed in most of the concave portion 12.

A duct communication port 14 is formed between the side surface 10c of the housing 2 opposite to the exhaust port 13 and the top plate 10d. A duct 15 is provided on the side surface 10c on the side where the duct communication port 14 is formed. The duct 15 extends in the Z direction and extends throughout the Y direction. The duct 15 is formed in a substantially rectangular cylindrical shape together with the side surface 10c, and forms a ventilation path 16 inside.

The duct 15 has a duct side surface 15a facing the side surface 10c connected to a top plate 10d of the shutter case 10. Thereby, the ventilation path 16 is shut off from the outside air. The ventilation path 16 communicates with the duct communication port 14 at the upper end in the Z direction. The ventilation passage 16 communicates with the inside of the housing 2 via the housing communication port 25 of the housing 2 at the lower end in the Z direction.

A partition plate (corresponding to a first partition plate in the claims 17 is provided on a lower edge of the duct communication port 14 in the shutter case 10. The partition plate 17, together with the shutter 11, partitions the inside of the shutter case 10 into two rooms (a positive pressure chamber 23 and a negative pressure chamber 24). The partition plate 17 is formed of a metal plate. The partition plate 17 extends obliquely downward from the lower edge of the duct communication port 14 along the rotation locus of the shutter 11.

On the side surface 10c of the shutter case 10 where the duct communication port 14 is formed, a plate-shaped stopper 18 is provided closer to the housing 2 than the partition plate 17. The stopper 18 regulates the amount of rotation of the shutter 11 and regulates the direction of the wind W in the shutter case 10. The stopper 18 is formed of a metal plate. The stopper 18 extends obliquely upward from the side surface 10c of the shutter case 10 toward the inside of the shutter case 10 and in contact with the lower end of the partition plate 17. The stopper 18 extends to the vicinity of the exhaust port 13 of the shutter case 10.

The shutter 11 is arranged between a lower end of a step surface 10e formed on the shutter case 10 and a stopper 18. The shutter 11 includes a shutter main body 21 having a substantially flat plate shape, and a rotation shaft 22 provided on the shutter main body 21.

The shutter main body 21 is formed in a substantially square shape in plan view. The rotation shaft 22 is disposed substantially at the center of one side of the shutter main body 21, along the other side orthogonal to the one side, and along the surface direction of the shutter main body 21. The rotation shaft 22 is attached to a lower end of a step surface 10e formed on the shutter case 10. The lower end of the step surface 10e and the rotating shaft 22 are substantially parallel, and both extend in the Y direction. Thereby, the shutter main body 21 is rotated around the rotation shaft 22.

When the shutter 11 rotates, the exhaust port 13 of the shutter case 10 opens and closes the exhaust port 13 with respect to the rotation shaft 22 of the shutter main body 21. More specifically, when the shutter main body 21 is in a direction along the X-Y plane, that is, in a state substantially parallel to the top plate 10d, the shutter main body 21 closes the exhaust port 13. When the shutter main body 21 is rotated from the closed state and the shutter main body 21 is inclined above the exhaust port 13, the exhaust port 13 is opened.

One end 21a of the shutter main body 21 on the opposite side to the exhaust port 13 extends to the partition plate 17 in the shutter case 10.

The partition plate 17 is curved along the rotation locus of the one end 21a of the shutter main body 21. A minute gap is formed between the partition plate 17 and one end 21a of the shutter main body 21. Therefore, the partition plate 17 and the shutter main body 21 do not interfere with each other.

The inside of the shutter case 10 is partitioned by the partition plate 17 and the shutter 11 into a positive pressure chamber 23 (corresponding to a first chamber in claims) on the side where the fan 6 is disposed and a negative pressure chamber 24 (corresponding to a second chamber in the claims) on the side where the duct communication port 14 is formed.

The negative pressure chamber 24 communicates with the inside of the housing 2 through the duct communication port 14, the ventilation path 16 of the duct 15, and the housing communication port 25.

As described above, the portion of the shutter main body 21 closer to the exhaust port 13 than the rotation shaft 22 functions as an opening and closing plate 26 for opening and closing the exhaust port 13. A portion of the shutter main body 21 closer to the partition plate 17 than the rotation shaft 22 functions as a partition plate 27 that partitions the inside of the shutter case 10. That is, the positive pressure chamber 23 and the negative pressure chamber 24 are partitioned by the rotation shaft 22.

The center of gravity of the shutter main body 21 is positioned slightly closer to the one end 21a than the rotation shaft 22. Thereby, in the shutter main body 21, the partition plate 27 is slightly lowered in the no-load state, and the opening and closing plate 26 is slightly lifted. As a result, in the no-load state, the shutter main body 21 is inclined to such an extent that the exhaust port 13 is slightly opened.

Next, the operation of the ventilation devices 5A and 5B will be described.

In a state where the ventilation devices 5A and 5B are stopped, the exhaust port 13 is slightly opened since it is the no-load state. Thereby, the inside of the housing 2 is naturally ventilated.

As shown in FIG. 1, when the fan 6 of the ventilation devices 5A and 5B is driven, a wind W is generated by the fan 6 (forced ventilation). The wind W flows from the inside of the housing 2 to the positive pressure chamber 23 of the shutter case 10 through the fan shroud 8, the fan blade 9, and the opening 2b. Thereby, the inside of the housing 2 is a negative pressure region Np. The positive pressure chamber 23 is a positive pressure region Pp. The negative pressure chamber 24 of the shutter case 10 communicates with the inside of the housing 2 through the duct communication port 14, the ventilation path 16 of the duct 15, and the housing communication port 25. The housing communication port 25 is formed radially outward of the fan shroud 8. That is, the negative pressure chamber 24 communicates only with the negative pressure region Np of the housing 2. Therefore, the negative pressure chamber 24 becomes a negative pressure region Np.

The stopper 18 provided on the housing 2 side of the shutter main body 21 extends from the side surface 10c of the shutter case 10 to the vicinity of the exhaust port 13. Therefore, the partition plate 27 of the shutter main body 21 is hardly affected by the wind W by the fan 6.

On the other hand, the opening and closing plate 26 of the shutter 11 tends to be pushed upward under the pressure of the positive pressure chamber 23 (see the arrow Y1 in FIG. 1). The partition plate 27 of the shutter 11 also tends to be sucked upward (toward the duct communication port 14) by receiving pressure from the negative pressure chamber 24 (see Y2 in FIG. 1).

The shutter main body 21 is provided such that the center of gravity is positioned slightly closer to the one end 21a than the rotation shaft 22 and the pressure F2 received from the negative pressure chamber 24 is smaller than the pressure F1 received from the positive pressure chamber 23.

For example, a minute gap is formed between the partition plate 17 and the partition plate 27. The air in the negative pressure chamber 24 leaks from the minute gap. Due to such air leakage, the pressure received by the shutter main body 21 from the negative pressure chamber 24 becomes smaller than the pressure received from the positive pressure chamber 23. In addition, the size of the shutter case 10 is sufficiently smaller than the size of the housing 2. For this reason, the pressure in the positive pressure chamber 23 tends to increase compared to the magnitude of the pressure in the negative pressure chamber 24 communicated with the inside of the housing 2. Thereby, the pressure received by the shutter main body 21 from the negative pressure chamber 24 becomes smaller than the pressure received from the positive pressure chamber 23.

When the fan 6 is driven in this manner, the opening and closing plate 26 is pushed up, and the inclination of the shutter 11 increases. Thereby, the exhaust port 13 is opened to a greater extent than in the case of natural ventilation. When the inclination of the shutter 11 increases, the partition plate 27 comes into contact with the stopper 18. Thereby, the inclination of the shutter 11 is maintained at a desired inclination without separating the shutter 11 from the partition plate 17. The wind W from the fan 6 is also rectified (restricted) by the stopper 18 and smoothly flows to the exhaust port 13 side.

The two ventilation devices 5A and 5B may be used for so-called fan redundancy or for so-called fan backup. When used as a fan redundancy, two of them are driven simultaneously or only one is driven according to the heat radiation state of the power conversion unit 3 or the like. When used as a fan backup, one of the two ventilation devices 5A and 5B is constantly driven. In this case, when one of the ventilation devices 5A and 5B fails and stops, the other ventilation devices 5A and 5B are driven.

Hereinafter, a case where only one ventilation device 5A of the two ventilation devices 5A and 5B is driven and the other ventilation device 5B is stopped for fan redundancy or fan backup will be described with reference to FIG. 1.

When the other ventilation device 5B is stopped, the exhaust port 13 of the ventilation device 5B is slightly opened. When one of the ventilation devices 5A is driven in this state, the positive pressure chamber 23 of the ventilation device 5A becomes a positive pressure region Pp. The positive pressure chamber 23 of the other ventilation device 5B is set to the atmospheric pressure through the exhaust port 13. On the other hand, the inside of the housing 2 and the negative pressure chamber 24 of each of the ventilation devices 5A and 5B communicating with the inside of the housing 2 are a negative pressure region Np.

Therefore, the partition plate 27 of the shutter 11 in the other ventilation device 5B receives the pressure from the negative pressure chamber 24 and is sucked upward (toward the duct communication port 14) (see Y3 in FIG. 1). Thereby, in the other ventilation device 5B, the exhaust port 13 is closed by the shutter 11. As a result, a short circuit in which air circulates between one ventilation device 5A and the other ventilation device 5B is prevented.

As described above, the above-described shutter unit 7 includes the shutter case 10 in which an exhaust port 13 is formed, the shutter 11 that is rotatably provided so as to open and close an exhaust port 13 of the shutter case 10 and partitions the inside of the shutter case 10 into the positive pressure chamber 23 and the negative pressure chamber 24, and the fan 6 that exhausts the air in the housing 2 to the outside through the exhaust port 13 of the shutter case 10. The positive pressure chamber 23 communicates with the exhaust port 13. The negative pressure chamber 24 communicates only with the negative pressure region Np in the housing 2 through the duct communication port 14, the ventilation path 16 of the duct 15, and the housing communication port 25. The center of gravity of the shutter main body 21 is positioned slightly closer to the one end 21a than the rotation shaft 22. The shutter main body 21 is provided so that the pressure F2 received from the negative pressure chamber 24 is smaller than the pressure F1 received from the positive pressure chamber 23.

Therefore, when the two ventilation devices 5A and 5B are stopped, the exhaust port 13 is slightly opened, and the inside of the housing 2 can be naturally ventilated. In a state where the two ventilation devices 5A and 5B are driven, the exhaust port 13 is reliably opened, and the forced ventilation inside the housing 2 can be reliably performed.

When only one of the two ventilation devices 5A and 5B is driven and the other is stopped, the partition plate 27 of the shutter 11 is sucked up by the negative pressure chamber 24 in the stopped ventilation devices 5A and 5B. Therefore, the exhaust ports 13 of the stopped ventilation devices 5A and 5B can be reliably closed. Therefore, a short circuit between the two ventilation devices 5A and 5B can be prevented.

As described above, since the opening and closing operation of the shutter 11 can be reliably performed using the negative pressure chamber 24, it is not necessary to accurately position the rotation shaft 22 with respect to the shutter main body 21. Even if the rotating shaft 22 deteriorates over time, the shutter 11 can be reliably opened and closed. Therefore, design and manufacture of the shutter 11 can be facilitated.

Since the shutter 11 can always be properly operated, the power conversion unit 3 can be effectively cooled by the ventilation devices 5A and 5B.

The positive pressure chamber 23 and the negative pressure chamber 24 in the shutter case 10 are partitioned by a rotation shaft 22. Thereby, the function of the shutter main body 21 can be divided into the function of an opening and closing plate 26 and the function of the partition plate 27 with the rotation shaft 22 interposed therebetween. For example, if the rotation shaft 22 is provided at a position separated from the step surface 10e, the function of the shutter main body 21 cannot be divided into the function of the opening and closing plate 26 and the function of the partition plate 27 with the rotation shaft 22 interposed therebetween. As in the first embodiment, when the function can be divided into the function of the opening and closing plate 26 and the function of the partitioning plate 27 with the rotating shaft 22 interposed therebetween, the positioning of the rotating shaft 22 with respect to the shutter main body 21 can be further facilitated.

The shutter main body 21 is formed in a substantially square shape in plan view. The rotation shaft 22 is disposed substantially at the center of one side of the shutter main body 21, along the other side orthogonal to the one side, and along the surface direction of the shutter main body 21. The partition plate 17 is curved along the rotation locus of the one end 21a of the shutter main body 21. With this configuration, the inside of the shutter case 10 can be easily partitioned into the positive pressure chamber 23 and the negative pressure chamber 24. Thereby, the manufacturing cost of the shutter unit 7 can be reduced.

The shutter case 10 is provided with a stopper 18 for regulating the amount of rotation of the shutter 11. Therefore, the inclination of the shutter 11 can be maintained at a desired inclination without separating the shutter 11 from the partition plate 17.

The stopper 18 extends obliquely upward from the side surface 10c of the shutter case 10 toward the inside of the shutter case 10. The stopper 18 extends to the vicinity of the exhaust port 13 of the shutter case 10. Therefore, the wind W generated by the fan 6 is rectified (restricted) by the stopper 18, and the air in the housing 2 can flow smoothly toward the exhaust port 13.

The shutter case 10 is provided outside the one surface 2a of the housing 2. The fan 6 is provided in the housing 2 so as to face the opening 10a of the shutter case 10. As described above, by effectively utilizing the empty space in the housing 2, it is possible to prevent the shutter case 10 from increasing in size as compared with the case where the fan 6 is arranged in the shutter case 10. Thereby, the manufacturing cost of the shutter unit 7 can be reduced.

The center of gravity of the shutter main body 21 is positioned slightly closer to the one end 21a than the rotation shaft 22. Thereby, it is possible to surely and naturally ventilate the inside of the housing 2 while the ventilation devices 5A and 5B are stopped. Especially, for example, it is suitable when it is necessary to continue cooling the inside of the housing 2 even when the ventilation devices 5A and 5B are urgently stopped.

In the above-described first embodiment, the case where the partition plate 17 is formed of a metal plate has been described. However, the present invention is not limited to this, and may be formed of a soft material such as a resin or a film. With this configuration, the partition plate 17 can be easily formed in a curved shape. Thereby, the manufacturing cost of the shutter unit 7 can be further reduced.

In the above-described first embodiment, the case where the center of gravity of the shutter main body 21 is positioned slightly closer to the one end 21a than the rotation shaft 22 has been described. However, it is not limited to this.

For example, when the center of gravity of the shutter main body 21 is set to the position of the rotation shaft 22, that is, the center of the shutter main body 21 in the X direction, the shutter main body 21 is hardly affected by its own weight. Thereby, it is possible to easily open and close the exhaust port 13 by the shutter main body 21 using the wind W (wind pressure) of the fan 6. For example, even when the fan 6 is downsized, the shutter main body 21 can be easily opened and closed.

For example, when the center of gravity of the shutter main body 21 is positioned slightly opposite to the one end 21a with respect to the rotation shaft 22, the opening and closing plate 26 is lowered and the partition plate 27 is lifted in the no-load state. Thereby, the exhaust port 13 is closed and foreign matter can be prevented from entering through the exhaust port 13. Therefore, it can be suitably used when the installation environment of the ventilation devices 5A and 5B is poor and foreign matter countermeasures are required.

Second Embodiment

Next, a second embodiment will be described with reference to FIG. 3.

Figure 3:
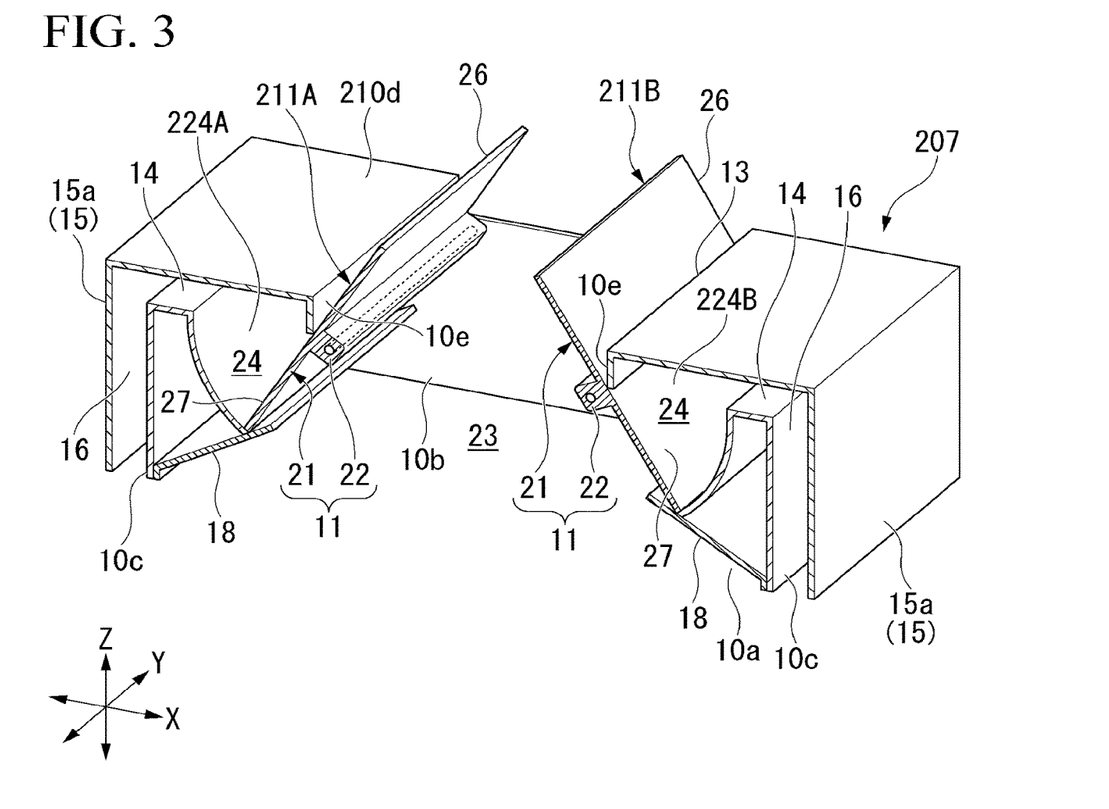
FIG. 3 is a perspective view of a cross section taken along the X-Z plane of a shutter unit according to a second embodiment.

FIG. 3 is a perspective view of a cross section along the X-Z plane of the shutter unit 207 according to the second embodiment. The same reference numerals are given to the same aspects as those in the first embodiment described above, and description thereof will be omitted (the same applies to the following embodiments and first modified examples).

As shown in FIG. 3, in the shutter unit 207 of the second embodiment, two shutter units 7 in the first embodiment are arranged symmetrically with respect to the Y-Z plane as a center to form one shutter unit 207. This is a difference from the first embodiment.

That is, the shutter case 210 of the shutter unit 207 has the exhaust port 13 formed in the center of the top plate 210d in the X direction. A step surface 10e is bent and extended downward at a side edge of the top plate 210d on the exhaust port 13 side. The first shutter member 211A and the second shutter member 211B are rotatably provided at the lower end of each step surface 10e. The exhaust port 13 is opened and closed by these two shutter members 211A and 211B.

The shutter case 210 is partitioned into one positive pressure chamber 23 and two negative pressure chambers 224A and 224B of a first negative pressure chamber 224A and a second negative pressure chamber 224B by two shutter members 211A and 211B. Each of the negative pressure chambers 224A and 224B is communicated with the inside of the housing 2 through two ducts 15 provided on both side surfaces 10c in the X direction of the shutter case 210 and two housing communication ports 25 formed on one surface 2a of the housing 2 (both are shown in FIG. 1 and not shown in FIG. 3).

Therefore, according to the above-described second embodiment, the same effects as those of the above-described first embodiment can be obtained.

In addition to this, in the second embodiment, the shutter 11 of the above-described first embodiment is configured by two shutter members 211A and 211B. The exhaust port 13 is opened and closed by these two shutter members 211A and 211B. Thereby, the size of each of the shutter members 211A and 211B can be made smaller than the size of the shutter 11 of the first embodiment.

In this regard, a case where the shutter members 211A and 211B open the exhaust port 13 and a case where the shutter 11 in the first embodiment opens the exhaust port 13 are compared. In this case, the projecting height of each of the shutter members 211A and 211B from the top plate 210a can be made lower than the projecting height of the shutter 11 from the top plate 10d in the first embodiment. Therefore, the occupied height of the shutter unit 207 can be suppressed, and the layout can be improved.

In addition, since the wind W from the fan 6 passes through the center of the shutter case 210 in the X direction, the flow of the wind W approaches a straight line along the Z direction. Therefore, the flow of the wind W becomes smooth, and the cooling efficiency of the power conversion unit 3 can be increased.

Third Embodiment

Next, a third embodiment will be described with reference to FIG. 4.

Figure 4:
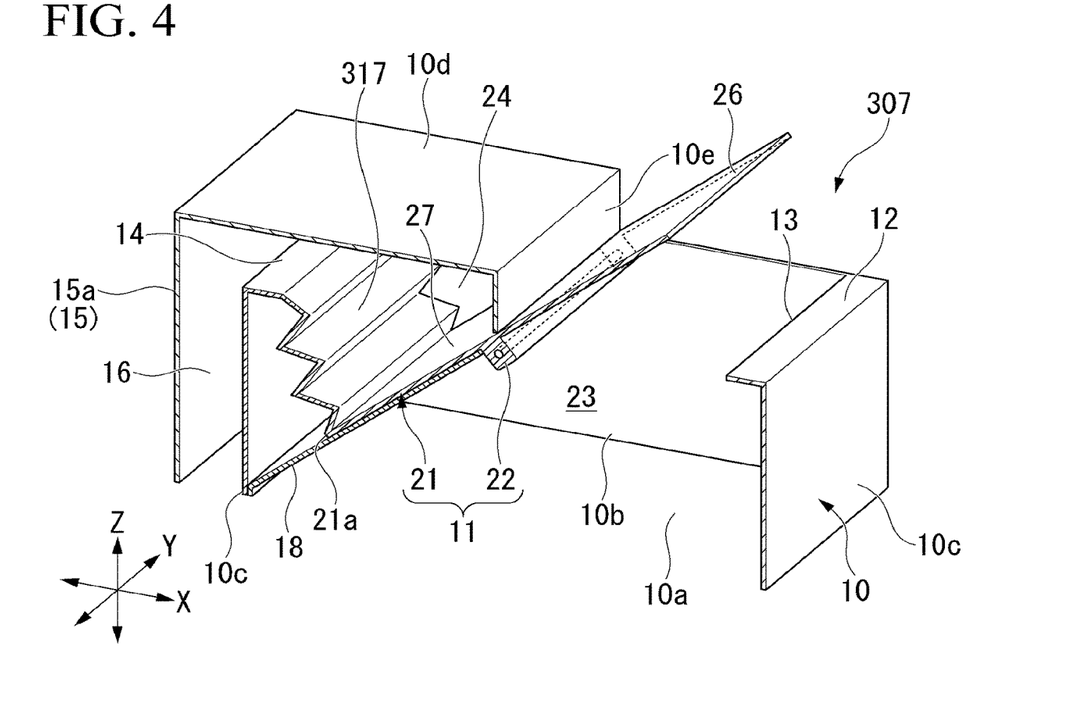
FIG. 4 is a perspective view of a cross section taken along an X-Z plane of a shutter unit according to a third embodiment.

FIG. 4 is a perspective view of a cross section along the X-Z plane of the shutter unit 307 according to the third embodiment.

As shown in FIG. 4, the difference between the first embodiment and the third embodiment is that the partition plate 17 in the first embodiment is different from the partition plate 317 (second partition plate in claims) in the third embodiment.

The partition plate 317 in the third embodiment is formed in a bellows shape so as to connect the lower edge of the duct communication port 14 in the shutter case 10 and one end 21a of the shutter main body 21. Since the partition plate 317 is formed in a bellows shape, the partition plate 317 can expand and contract in a direction approaching and separating from the duct communication port 14. Therefore, the rotation of the shutter 11 is not hindered by the partition plate 317. The inside of the shutter case 10 is partitioned into a positive pressure chamber 23 and a negative pressure chamber 24 by the partition plate 317 and the shutter main body 21 (the partition plate 27).

Therefore, according to the above-described third embodiment, the same effects as those of the above-described first embodiment can be obtained.

In addition, unlike the first embodiment, there is no need to form the partition plate 17 of a metal plate in a curved shape, so that the manufacturing cost of the shutter unit 307 can be reduced. As in the first embodiment, no minute gap is formed between the partition plate 17 and the one end 21a of the shutter main body 21. In the second embodiment, the partition plate 317 and the shutter main body 21 form a highly sealed negative pressure chamber 24. Thereby, it is possible to efficiently make the negative pressure chamber 24 become the negative pressure region Np.

In each of the above embodiments, the case where the fan 6 is provided inside the one surface 2a of the housing 2 has been described. However, the present invention is not limited to this, and the fan 6 may be provided in the shutter cases 10 and 210. With such a configuration, the ventilation devices 5A and 5B can be unitized, so that the manufacturing cost of the housing 2 can be reduced.

In each of the above embodiments, the case where the power conversion device 1 includes the two ventilation devices 5A and 5B has been described. However, the present invention is not limited to this, and the power conversion device 1 only needs to include at least one ventilation device (5A, 5B). The power conversion device 1 may include three or more ventilation devices.

In each of the above-described embodiments, a case has been described in which the fan 6 exhausts the air in the housing 2 to the outside through the exhaust ports 13 of the shutter units 7 and 207. However, the present invention is not limited to this, and the fan 6 may blow external air into the housing 2 through the exhaust port 13.

Figure 5:
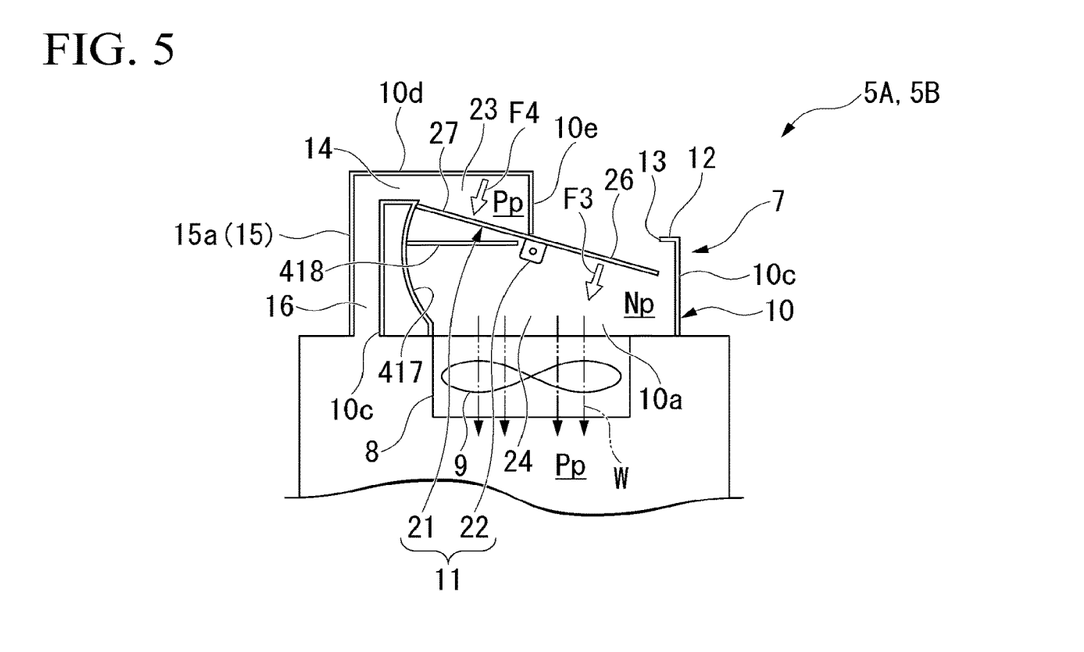
FIG. 5 is a schematic configuration diagram of a ventilation device according to a first modified example.

FIG. 5 is a schematic configuration diagram of the ventilation devices 5A and 5B in the first modified example.

The difference between the first modified example and the first embodiment is that, in the first modified example, the positive pressure chamber 23 in the shutter case 10 in the first embodiment described above becomes the negative pressure chamber 24 (negative pressure region Np), and the positive pressure chamber 23 (positive pressure region Pp) is formed in the shutter case 10 by the first partition plate 417 and the shutter main body 21.

The first partition plate 417 corresponds to the partition plate 17 of the first embodiment described above. A stopper 418 is provided in the middle of the first partition plate 417. The stopper 418 extends in the X direction from the first partition plate 417 and extends to the vicinity of the exhaust port 13 of the shutter case 10. The stopper 418 corresponds to the stopper 18 of the above-described first embodiment.

With such a configuration, the opening and closing plate 26 of the shutter main body 21 receives the pressure F3 drawn from the negative pressure chamber 24 into the shutter case 10. Further, the partition plate 27 of the shutter 11 also receives the pressure F4 that is pushed downward from the positive pressure chamber 23. The shutter main body 21 is provided such that the pressure F4 received from the positive pressure chamber 23 is smaller than the pressure F3 received from the negative pressure chamber 24. Thereby, the shutter 11 is rotated so that the opening and closing plate 26 is pulled into the shutter case 10 to open and close the exhaust port 13. When the exhaust port 13 is opened, the partition plate 27 of the shutter main body 21 is lifted. Thereby, the height of the top plate 10d in the shutter case 10 is higher than the height of the top plate 10d of the above-described first embodiment so that the partition plate 27 can be received.

Even in the case of such a configuration, the same effect as in the first embodiment can be obtained.

Figure 6:
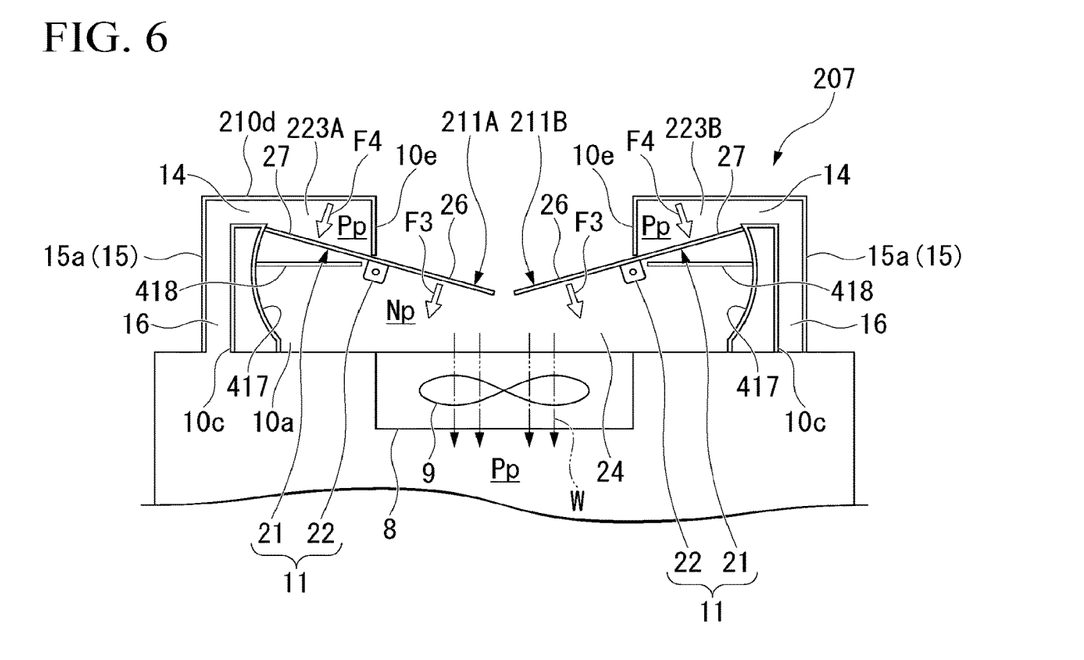
FIG. 6 is a schematic configuration diagram of a ventilation device according to a second modification.

FIG. 6 is a schematic configuration diagram of ventilation devices 5A and 5B in the second modification. The same aspects as those of the above-described second embodiment and the same aspects as those of the above-described first modification are denoted by the same reference numerals, and description thereof will be omitted.

The difference between the second modified example and the second embodiment is that, in the second modified example, the positive pressure chamber 23 in the shutter case 10 in the second embodiment described above becomes the negative pressure chamber 24 (negative pressure region Np), and the two negative pressure chambers 224A and 224B become two positive pressure chambers 223A and 223B (positive pressure region Pp).

In the second modification, a stopper 418 is provided as in the first modification.

Even in the case of such a configuration, the same effects as in the above-described second embodiment can be obtained.

According to at least one embodiment described above, the shutter units 7 and 207 include the shutter cases 10 and 210 in which the exhaust ports 13 are formed, the shutter 11 (the first shutter member 211A, the second shutter member 211B) that is provided rotatably so as to open and close the exhaust ports 13 of the shutter cases 10 and 210 and partitions the interior of shutter cases 10 and 210 into the positive pressure chamber 23 and the negative pressure chamber 24, and the fan 6 that exhausts the air in the housing 2 to the outside through the exhaust ports 13 of the shutter cases 10 and 210.

Therefore, when the two ventilation devices 5A and 5B are stopped, the exhaust port 13 is slightly opened, and the inside of the housing 2 can be naturally ventilated. When the two ventilation devices 5A and 5B are driven, the exhaust port 13 is reliably opened, and the inside of the housing 2 can be forcibly ventilated.

When only one of the two ventilation devices 5A and 5B is driven and the other is stopped, the exhaust port 13 of the other stopped ventilation devices 5A and 5B can be reliably closed. Therefore, a short circuit between the two ventilation devices 5A and 5B can be prevented.

Since the shutter 11 (the first shutter member 211A, the second shutter member 211B) is rotated using the pressure in the positive pressure chamber 23 and the pressure in the negative pressure chamber 24, there is no need that the rotation shaft 22 is positioned with respect to the shutter main body 21 with high accuracy. Even if the rotating shaft 22 has deteriorated over time, the shutter 11 (the first shutter member 211A, the second shutter member 211B) can be reliably opened and closed. Therefore, the design and manufacture of the shutter 11 (the first shutter member 211A, the second shutter member 211B) can be facilitated.

Since the shutter 11 (the first shutter member 211A, the second shutter member 211B) can always be properly operated, the power conversion unit 3 can be effectively radiated by the ventilation devices 5A and 5B.

The positive pressure chambers 23, 223A, 223B and the negative pressure chambers 24, 224A, 224B in the shutter case 10 are partitioned by the rotation shaft 22 as a boundary. Thereby, the function of the shutter main body 21 can be divided into the function of the opening and closing plate 26 and the function of the partition plate 27 with the rotary shaft 22 interposed therebetween, so that the positioning of the rotary shaft 22 with respect to the shutter main body 21 can be further facilitated.

The shutter main body 21 is formed in a substantially square shape in plan view. The rotation shaft 22 is disposed substantially at the center of one side of the shutter main body 21, along the other side orthogonal to the one side, and along the surface direction of the shutter main body 21. The partition plate 17 is curved along the rotation locus of the one end 21a of the shutter main body 21. With this configuration, the inside of the shutter case 10 can be easily partitioned into the positive pressure chamber 23 and the negative pressure chamber 24. Therefore, the manufacturing cost of the shutter units 7 and 207 can be reduced.

The shutter case 10 is provided with stoppers 18 and 418 that regulate the amount of rotation of the shutter 11 (the first shutter member 211A, the second shutter member 211B). Thereby, the shutter 11 (the first shutter member 211A, the second shutter member 211B) does not separate from the partition plate 17, and the inclination of the shutter 11 (the first shutter member 211A, the second shutter member 211B) can be maintained at a desired inclination.

Of the stoppers 18 and 418, the stopper 18 extends obliquely upward from the side surface 10c of the shutter case 10 toward the inside of the shutter case 10. The stopper 18 extends to the vicinity of the exhaust port 13 of the shutter case 10. Therefore, the wind W generated by the fan 6 is rectified (restricted) by the stopper 18, and the air in the housing 2 can flow smoothly toward the exhaust port 13.

The shutter case 10 is provided outside the one surface 2a of the housing 2. The fan 6 is provided in the housing 2 so as to face the opening 10a of the shutter case 10. As described above, by effectively utilizing the empty space in the housing 2, it is possible to prevent the shutter case 10 from increasing in size as compared with the case where the fan 6 is arranged in the shutter case 10. Thereby, the manufacturing cost of the shutter unit 7 can be reduced.

Although several embodiments of the present invention have been described, these embodiments are provided by way of example and are not intended to limit the scope of the invention. These embodiments can be implemented in other various forms, and various omissions, replacements, and changes can be made without departing from the spirit of the invention. These embodiments and their modifications are included in the scope and gist of the invention, and are also included in the invention described in the claims and equivalents thereof.

DESCRIPTION OF SYMBOLS

1: Power conversion device, 2: Case, 3: Power conversion unit, 4: Ventilation unit, 5A, 5B: Ventilation device, 6: Fan, 7, 207: Shutter unit, 10, 210: Shutter case, 11: Shutter, 13: Exhaust port (Opening), 17, 417: Partition plate (First partition plate), 18, 418: Stopper, 21: Shutter main body, 22: Rotating shaft, 23, 223A, 223B: Positive pressure chamber (First chamber), 24, 224A, 224B: Negative pressure chamber (Second chamber), 317: Partition plate (Second partition plate), Np: Negative pressure region, Pp: Positive pressure region

The invention claimed is:

1. A ventilation device comprising:
a housing;
a shutter case attached to the housing and having an opening;
a fan configured to perform one of air blowing outside air into the housing through the opening, and exhausting air inside the housing to outside through the opening; and
a shutter that is rotatably provided in the shutter case, the shutter partitioning inside of the shutter case into a first chamber communicated with the opening and a second chamber different from the first chamber, the shutter being configured to open and close the opening by a rotation operation,
wherein the fan is disposed in one of a first chamber side of the shutter case in the housing and the first chamber of the shutter case,
the first chamber is a first region that is one of a positive pressure region and a negative pressure region of the fan,
the second chamber is a second region that is the other of the positive pressure region and the negative pressure region of the fan,
the second chamber of the shutter case communicates only with a region same as the second region in the housing, and
the shutter is provided such that a pressure received from the second chamber is smaller than a pressure received from the first chamber.

2. The ventilation device according to claim 1, wherein the opening is an exhaust port,
the fan is configured to exhaust air in the housing to the outside through the exhaust port,
the first chamber is a positive pressure chamber, the second chamber is a negative pressure chamber, and
the negative pressure chamber of the shutter case communicates only with a negative pressure side region of the fan in the housing.

3. The ventilation device according to claim 1, wherein the first chamber and the second chamber are partitioned by a rotation axis of the shutter.

4. The ventilation device according to claim 1, wherein
the shutter has a first shutter member and a second shutter member,
opening and closing of the opening are performed by the first shutter member and the second shutter member, and
the second chamber has a third chamber partitioned from the first chamber by the first shutter member, and a fourth chamber partitioned from the first chamber by the second shutter member.

5. The ventilation device according to claim 1, wherein
the shutter is formed in a plate shape,
a rotation axis of the shutter is along a surface direction of the shutter,
a first partition plate is provided on the shutter case along a rotation locus of an end of the shutter in a direction orthogonal to the rotation axis, and
the first chamber and the second chamber are partitioned by the first partition plate and the shutter.

6. The ventilation device according to claim 1, wherein
the shutter is formed in a plate shape,
a rotation axis of the shutter is along a surface direction of the shutter,
a second partition plate is provided that connects one surface of the shutter case and an end of the shutter in a direction orthogonal to a rotation axis of the shutter, and
the first chamber and the second chamber are partitioned by the second partition plate and the shutter.

7. The ventilation device according to claim 1, comprising a stopper provided on the shutter case, configured to restrict a rotation amount of the shutter.

8. The ventilation device according to claim 7, wherein the stopper is disposed on a side opposite to the second chamber with the shutter interposed therebetween, and is a plate-like member that extends in a first direction from a vicinity of the fan to a vicinity of the opening and over an entire second direction orthogonal to the first direction in the shutter case.

9. The ventilation device according to claim 1, wherein
the shutter case is provided on an outer surface of the housing, and
the fan is provided at a position of the housing facing the shutter case.

10. A ventilation unit comprising at least two ventilation devices according to claim 1.

11. A power conversion device comprising:
the ventilation device according to claim 1, and
a power conversion unit housed in the housing.

* * * * *